(12) United States Patent
Hosaka

(10) Patent No.: US 11,421,339 B2
(45) Date of Patent: Aug. 23, 2022

(54) METHOD OF MANUFACTURING SIC SINGLE CRYSTAL AND COVERING MEMBER

(71) Applicant: SHOWA DENKO K.K., Tokyo (JP)

(72) Inventor: Yoshiteru Hosaka, Hikone (JP)

(73) Assignee: SHOWA DENKO K.K., Tokyo (JP)

( * ) Notice: Subject to any disclaimer, the term of this patent is extended or adjusted under 35 U.S.C. 154(b) by 61 days.

(21) Appl. No.: 16/559,845

(22) Filed: Sep. 4, 2019

(65) Prior Publication Data

US 2020/0080228 A1  Mar. 12, 2020

(30) Foreign Application Priority Data

Sep. 6, 2018  (JP) .............................. JP2018-167065

(51) Int. Cl.
*C30B 23/00* (2006.01)
*C30B 29/36* (2006.01)
*C30B 23/02* (2006.01)

(52) U.S. Cl.
CPC ............ *C30B 23/005* (2013.01); *C30B 23/02* (2013.01); *C30B 29/36* (2013.01)

(58) Field of Classification Search
CPC ....... C30B 23/00; C30B 23/005; C30B 23/02; C30B 29/36
See application file for complete search history.

(56) References Cited

U.S. PATENT DOCUMENTS

2005/0257734 A1* 11/2005 Madar ................. C30B 23/02
117/89

FOREIGN PATENT DOCUMENTS

| CN | 102534763 A | 7/2012 |
| CN | 104805504 A | 7/2015 |
| CN | 105734671 A | * 7/2016 |
| CN | 105734671 A | 7/2016 |
| JP | 2009-51700 A | 3/2009 |
| JP | 2009-280431 A | 12/2009 |
| JP | 2015-514673 A | 5/2015 |
| JP | 2016-56088 A | 4/2016 |
| JP | 2016-179920 A | 10/2016 |
| JP | 2019-156660 A | 9/2019 |
| WO | 2013/159083 A1 | 10/2013 |

OTHER PUBLICATIONS

Office Action dated Dec. 29, 2020 in Chinese Application No. 201910826014.1.
Notice of Reasons for Refusal dated May 31, 2022 from the Japanese Patent Office in Japanese Application No. 2018-167065.

* cited by examiner

*Primary Examiner* — Hua Qi
(74) *Attorney, Agent, or Firm* — Sughrue Mion, PLLC

(57) ABSTRACT

A method of manufacturing a SiC single crystal includes: a storing step of storing a SiC source, which is a powder, in an inner bottom part of a crucible, wherein the crucible is configured to store the SiC source and to attach a seed crystal to a position of the crucible which faces the SiC source; a placing step of placing a porous material on at least a portion of a first surface of the SiC source, wherein the first surface is positioned on a side of the seed crystal; and a crystal growth step of sublimating the SiC source by heating to grow a crystal on the seed crystal, in which the porous material is formed of carbon or a carbide, and the hole diameter of the porous material is smaller than the average particle diameter of the SiC source.

9 Claims, 3 Drawing Sheets

METHOD OF MANUFACTURING SIC SINGLE CRYSTAL AND COVERING MEMBER

BACKGROUND OF THE INVENTION

Field of the Invention

The present invention relates to a method of manufacturing a SiC single crystal and a covering member.

Priority is claimed on Japanese Patent Application No. 2018-167065, filed on Sep. 6, 2018, the content of which is incorporated herein by reference.

Description of Related Art

Silicon carbide (SiC) has a dielectric breakdown electric field one digit larger and a band gap three times larger, than silicon (Si). In addition, the silicon carbide (SiC) has properties that a thermal conductivity thereof is approximately three times higher than that of silicon (Si). The silicon carbide (SiC) is expected to be applied to a power device, a high frequency device, a high temperature operation device, and the like.

For a device such as a semiconductor, a SiC epitaxial wafer in which an epitaxial film is formed on a SiC wafer is used. The epitaxial film provided on the SiC wafer by chemical vapor deposition (CVD) method becomes an active region of a SiC semiconductor device. The SiC wafer is obtained by processing a SiC ingot.

The SiC ingot can be produced by a method such as sublimation recrystallization method (hereinafter, referred to as a sublimation method). The sublimation method is a method of obtaining a large single crystal by recrystallizing a SiC source gas sublimated from a SiC source on a seed crystal. In order to obtain the SiC ingot with a high quality, a method of suppressing a defect or heterogeneous polymorphism (there are crystals of different polytypes in a mixed state) is required.

Patent document 1 describes that a porous sintered body of SiC is used as a SiC source. When using the porous sintered body, sublimation gas composition can be prevented from varying and a change in a sublimation rate with time can be suppressed.

Patent document 2 describes a method of manufacturing a SiC single crystal using two raw materials in which a degree of metal impurity content is different from each other. The raw material having a high degree of the impurity content is covered with the raw material having a low degree of the impurity content. When using the manufacturing method described in Patent document 2, mixing of the metal impurity into a SiC single crystal is suppressed.

However, a defect or the like may occur in the single crystal obtained by the crystal growth in some cases, and a method of further improving a quality of the SiC single crystal was required.

CITATION LIST

Patent Documents

Patent document 1: Japanese Unexamined Patent Application, First Publication No. 2016-179920
Patent document 2: Japanese Unexamined Patent Application, First Publication No. 2009-051700

SUMMARY OF THE INVENTION

Technical Problem

The present invention was made in view of the problems described above, and an object thereof is to provide a method of manufacturing a SiC single crystal and a covering member, which can prevent soaring of a remaining carbon powder which may be caused after Si is sublimated first from a SiC source powder.

Solution to Problem

The present inventors found that when covering a surface of a SiC source powder contained in a crucible with a covering member, the soaring of the SiC source powder is suppressed.

That is, the present invention provides means as follows, in order to solve the problems.

(1) A method of manufacturing a SiC single crystal according to a first aspect, includes: a storing step of storing a SiC source, which is a powder, in an inner bottom part of a crucible, wherein the crucible is configured to store the SiC source and to attach a seed crystal to a position of the crucible which faces the SiC source; a placing step of placing a porous material on at least a portion of a first surface of the SiC source, wherein the first surface is positioned on a side of the seed crystal; and a crystal growth step of sublimating the SiC source by heating to grow a crystal on the seed crystal, in which the porous material is formed of carbon or a carbide, and the hole diameter of the porous material is smaller than the average particle diameter of the SiC source.

The method of manufacturing a SiC single crystal of the first aspect preferably includes the following features (2) to (5). It is also preferable to combine two or more of these features.

(2) In the method of manufacturing a SiC single crystal according to the aspect, the porous material may cover 70% or more of the first surface of the SiC source.

(3) In the method of manufacturing a SiC single crystal according to the aspect, the porous material may have an opening at a center thereof, and the porous material may cover an outer side of the first surface of the SiC source.

(4) In the method of manufacturing a SiC single crystal according to the aspect, the porous material has a face A on the side of the seed crystal and a face B on a side of the SiC source, and may have a plurality of holes communicating in a thickness direction from the face A to the face B.

(5) In the method of manufacturing a SiC single crystal according to the aspect, the thickness of the porous material may be smaller than 40% of the height of the stored SiC source.

(6) A covering member for crystal growth according to a second aspect, which is provided in a crucible, which is used to grow a single crystal using a sublimation method, to cover a surface of a SiC source which is stored in the crucible, the member consists of a porous material of carbon or a carbide, in which a hole diameter of the porous material is smaller than an average particle diameter of the stored SiC source.

Advantageous Effects of Invention

According to the method of manufacturing a SiC single crystal and the covering member according to the aspects, soaring of a remaining carbon powder, which is caused by the sublimation of Si from a SiC source powder which is caused at first, can be suppressed.

DETAILED DESCRIPTION OF THE INVENTION

Figure 1:
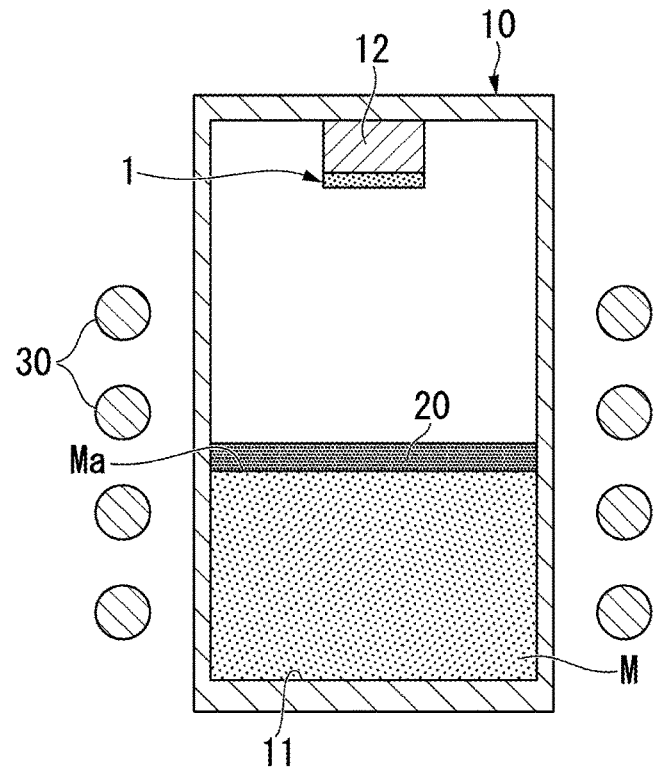
FIG. 1 is a schematic sectional diagram showing an example of a crucible for explaining a method of manufacturing a SiC single crystal according to a first embodiment.

Hereinafter, preferable examples of the present embodiment will be described in detail, with reference to drawings as appropriate. In the drawings used in the following description, for the sake of convenience, a feature part may be enlarged and shown, and a dimension and a ratio of each component may be different from an actual one. In the following description, materials, dimensions, and the like are exemplary examples. The present invention is not limited thereto, and can be performed with appropriate modifications within the scope not changing the gist thereof. For example, unless otherwise particularly specified, the number, shape, size, length, and the like may be changed, added, or omitted as needed.

"Method of Manufacturing SiC Single Crystal"

First Embodiment

FIG. 1 is a sectional diagram of a crucible, for explaining a method of manufacturing a SiC single crystal according to a first embodiment. First, a crucible 10 used in the method of manufacturing a SiC single crystal will be described. FIG. 1 shows an internal structure of the crucible 10 and a heater 30 that heats the crucible 10.

The crucible 10 is a container that encloses an internal space. The crucible 10 shown in FIG. 1 includes an inner bottom part 11 and a crystal placing part 12 facing the inner bottom part 11. In the inner bottom part 11, a SiC source M is stored. A seed crystal 1 is placed on the crystal placing part 12. For example, the crystal placing part 12 protrudes toward the SiC source M in a cylindrical shape at a central position as viewed from a side of the SiC source M. For the crystal placing part 12, for example, a carbon material such as graphite can be used. The crystal placing part 12 is not necessarily required, and the seed crystal 1 may be placed on an upper face on an inner portion of the crucible 10.

The heater 30 covers an outer circumference of the crucible 10. As the heater 30, for example, a high frequency heating coil can be used. When applying a high frequency current to the coil, the crucible 10 can be heated by electromagnetic induction.

In the method of manufacturing a SiC single crystal according to the first embodiment, the crucible 10 described above is used. The method of manufacturing a SiC single crystal according to the first embodiment includes a storing step, a placing step, and a crystal growth step.

<Storing Step>

In the storing step, the SiC source M is stored in the inner bottom part 11 of the crucible 10. For example, the inner bottom part 11 is filled with a powdery SiC source material as a raw material. It is preferable that a first surface Ma of the SiC source M on a side of the seed crystal 1 is smoothed, that is, has a flat surface, in order to enhance symmetry to the seed crystal 1.

A average particle diameter of powder particles which forms the SiC source M to be stored can be optionally selected, but the average particle diameter is preferably 30 μm or more and 1000 μm or less, more preferably 90 μm or more and 600 μm or less, and still more preferably 200 μm or more and 400 μm or less.

The average particle diameter of the powder particles is, for example, a diameter (D50) of the particles, which can be obtained when an integrated value in a distribution curve obtained by particle size distribution measurement is 50%. The particle size distribution of particles can be measured by a particle size distribution measuring apparatus using a laser diffraction and scattering method (a microtrac method).

<Placing Step>

In the placing step, a porous material 20 is placed on at least a portion of the first surface Ma of the SiC source M. The porous material 20 shown in FIG. 1 entirely covers the first surface Ma of the SiC source M. The porous material 20 is a covering member having a hole therein.

The porous material 20 is formed of carbon or a carbide. A carbide can be optionally selected, but preferable examples thereof include SiC or TaC.

For example, a sintered body of the carbide (a SiC sintered body or a TaC sintered body) is an example of the porous material 20.

In a case where the porous material 20 is SiC such as the SiC sintered body, the porous material 20 can also function as a SiC source.

The hole diameter of the porous material 20 is smaller than the average particle diameter of the powder particles which forms the SiC source M. The hole diameter of the porous material 20 is preferably 70% or less, more preferably 60% or less, and still more preferably 50% or less, of the average particle diameter of the powder particles which forms the SiC source M. A lower limit of the aforementioned percentages can be optionally selected, but the lower limit may be, for example, 5% or more, 10% or more, 20% or more, or 40% or more. However, the lower limit is not limited thereto. The hole diameter of the porous material 20 is obtained by, for example, mercury porosimetry.

A porosity of the porous material 20 can be optionally selected, but the porosity is preferably 40% or more and 60% or less, more preferably 43% or more and 55% or less, and still more preferably 45% or more and 50% or less. The porosity of the porous material 20 can be obtained by the following equation.

"Porosity (%)"={1−("Measured mass (g) of porous material 20"/"Theoretical density (g/cm$^3$) of material which forms porous material 20")/ "Volume (cm$^3$) of porous material 20"}×100

A thickness of the porous material 20 is preferably 40% or less of the height of a vertical line from the first surface Ma of the SiC source M before crystal growth to the inner bottom part 11. The percentage may be 35% or less, and may also be 30% or less. Sufficient SiC source gas can be supplied to the seed crystal 1 via the porous material 20, and a crystal growth rate of the seed crystal 1 is maintained. A lower limit of the aforementioned percentage can be optionally selected. For example, the percentage may be 1% or more, 5% or more, 10% or more, or 15% or more.

<Crystal Growth Step>

The seed crystal 1 is placed on the crystal placing part 12 at a position facing the SiC source M. The placement of the seed crystal 1 may be performed before or after storing the SiC source M. After storing the seed crystal 1 and the SiC source M, the crucible 10 is sealed.

In the crystal growth step, an induced current is generated in the crucible 10 by applying a high frequency current to the heater 30, and therefore the crucible 10 generates heat. The SiC source M heated by the crucible 10 is sublimated and recrystallized on a surface of the seed crystal 1 and crystal growth of the seed crystal 1 occurs.

During the crystal growth, silicon of the SiC source M is likely to be sublimated more than carbon. Therefore, carbon powder may remain in the first surface Ma of the SiC source M in some cases. Since a gas sublimated from the SiC source M goes to the seed crystal 1, convection occurs in the crucible 10. The carbon powder swirls up by the convection. In a case where there is no porous material 20, the amount of carbon powder swirling up is greater than in a case where there is the porous material 20. The carbon powder swirling up is incorporated into a single crystal which grows (carbon inclusion). The carbon inclusion in the single crystal causes a defect and heterogeneous polymorphism, which degrades a quality of the single crystal.

On the other hand, according to the method of manufacturing a SiC single crystal according to the present embodiment, the porous material 20 can prevent the carbon powder from swirling up. The hole diameter of the porous material 20 is smaller than the average particle diameter of the powder particles which forms the SiC source M, and therefore it is possible to inhibit the carbon powder from reaching the seed crystal 1.

As described above, examples of the preferable embodiment of the present invention are explained in detail, but the present invention is not limited to the embodiment. Various modifications and changes can be made within the scope of the present invention described in claims.

Modification Example 1

Figure 2:
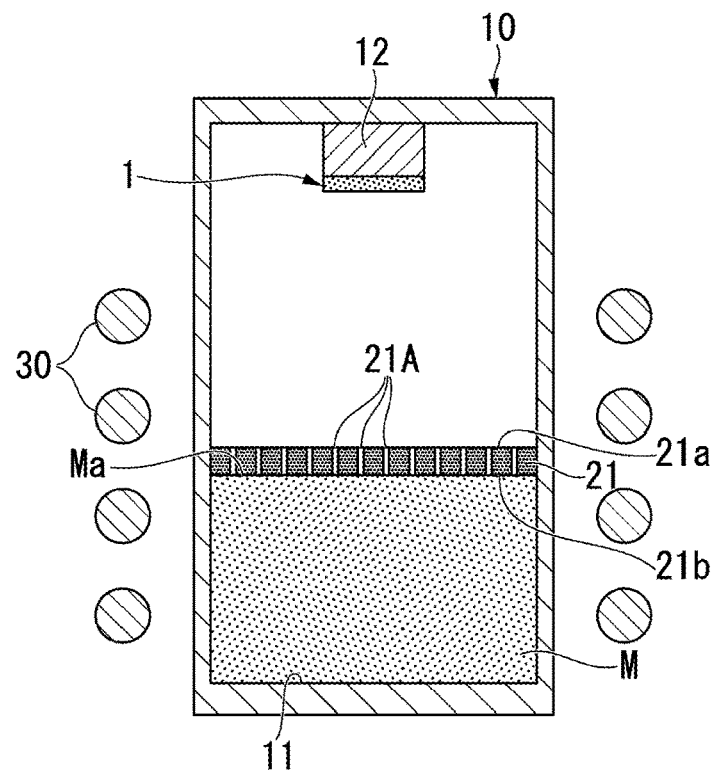
FIG. 2 is a schematic sectional diagram showing another example of the crucible for explaining the method of manufacturing a SiC single crystal according to the first embodiment.

FIG. 2 is a sectional diagram of another example of the crucible, for explaining a method of manufacturing a SiC single crystal according to the first embodiment. Modification Example 1 is different from the porous material 20 shown in FIG. 1 in a configuration of a porous material 21. The other configurations are the same as the configurations shown in FIG. 1, and descriptions thereof will be omitted.

The porous material 21 shown in FIG. 2 has a plurality of holes 21A communicating in a thickness direction from a first face 21a (face A) to a second face 21b (face B). The first face 21a (face A) is a face of the porous material 21 on a side of the seed crystal 1, and the second face 21b is a face of the porous material 21 on a side of the SiC source M.

The hole 21A is formed in a sintered body after producing a compact sintered body. A hole diameter and a shape of the hole 21A can be designed freely. For example, the hole 21A can be formed substantially perpendicular to the first face 21a (face A) and the second face 21b (face B).

The shape of the hole 21A may be, for example, circular or substantially circular in a plan view, but is not limited to these examples. The shape or a size of the hole 21A may be all the same in confirmation in the plan view. When the area of the first surface Ma of the SiC source M is considered as 100%, the total area (total opening area) of the holes 21A in the plan view is preferably 5% or more, and may be 10% or more, or 20% or more. It is preferable that the upper limit of the total area of the holes 21A is as large as possible. When the strength of the porous material 21 is taken into consideration, the upper limit of the total area of the holes 21A is preferably 50% or less, and may be 40%, or less or 30% or less. However, the present invention is not limited to only these examples.

The hole diameter of the hole 21A is smaller than the average particle diameter of the powder particles which forms the SiC source M. The hole diameter of the hole 21A is preferably 70% or less, more preferably 60% or less, and still more preferably 50% or less, of the average particle diameter of the powder particles which forms the SiC source M. A lower limit of the percentages can be optionally selected, but the lower limit may be, for example, 5% or more, 10% or more, 20% or more, or 40% or more. However, the lower limit is not limited thereto. The hole diameter of the hole 21A can be measured by mercury porosimetry. In addition, the hole diameter may be obtained as an average value of optionally selected 10 holes in a cut face along an in-plane direction of the porous material 21.

In a case of Modification Example 1, a porosity of the porous material 21 is not limited. A portion other than a portion where the hole 21A is formed may be compact and may not have a void.

The hole diameter of the hole 21A is preferably substantially constant in the thickness direction of the porous material 21. Also, each hole diameter of a plurality of the holes 21A is preferably substantially constant. The term "substantially constant" means that a variation rate of the hole diameter is less than 10% between a portion where the hole diameter is the maximum and a portion where the hole diameter is the minimum. The variation rate of the hole diameter is determined by {1−("Minimum diameter"/"Maximum diameter")×100.

As described above, also in Modification Example 1, swirling up of the carbon powder can be suppressed. Also, the hole 21A of the porous material 21 can be designed freely, and can adjust a supply amount or the like of the SiC source gas from the SiC source M.

Modification Example 2

Figure 3:
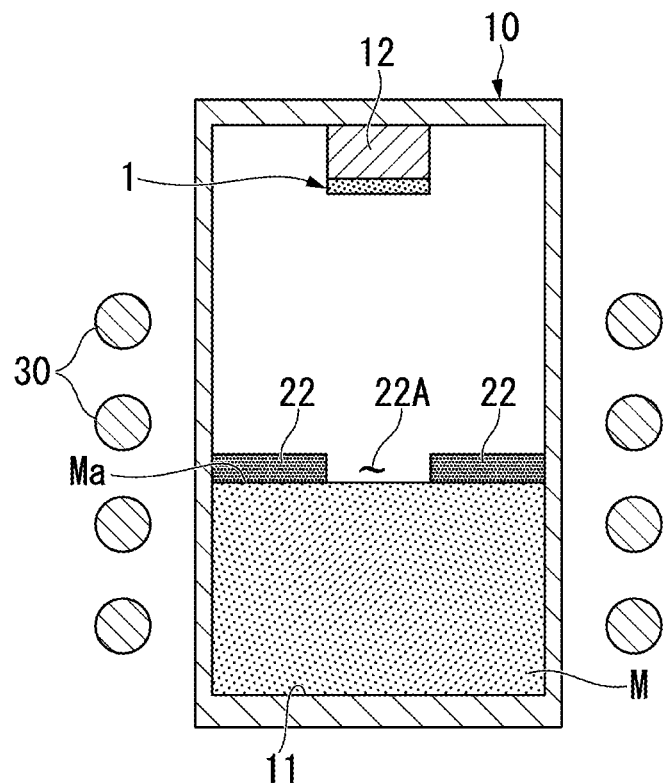
FIG. 3 is a schematic sectional diagram showing still another example of the crucible for explaining the method of manufacturing a SiC single crystal according to the first embodiment.

FIG. 3 is a sectional diagram of another example of the crucible, for explaining a method of manufacturing a SiC single crystal according to a first embodiment. Modification Example 2 is different from the porous material 20 shown in FIG. 1 in a configuration of a porous material 22. Modification Example 2 has a configuration in which a hole is opened at the center of the porous material 20. The other configurations are the same as the configurations shown in FIG. 1, and descriptions thereof will be omitted.

The porous material 22 shown in FIG. 3 is different from FIG. 1 in that the porous material 22 does not entirely cover the first surface Ma of the SiC source M. When an area of the first surface Ma is 100%, the porous material 22 preferably covers 70% or more of the first surface Ma of the SiC source M. The aforementioned percentage can be optionally selected, and the porous material 22 may cover 80% or more, 90% or more, or 95% or more. An upper limit of the percentage can be optionally selected, for example, the percentage may be 98% or less, 95% or less, or 90% or less.

The porous material 22 has one opening 22A at a center. The porous material 22 shown in FIG. 3 covers an outer side of the first surface Ma of the SiC source M.

The crucible 10 is heated from the outer side by the heater 30 and a temperature of the central part of the crucible 10 is lower than the outer side. Sublimation of the SiC source M contained in the crucible 10 occurs mainly at an outer peripheral part of the crucible 10. Therefore, the carbon powder generated by the sublimation of the SiC source M is likely to be generated at the outer peripheral part.

As described above, also in Modification Example 2, swirling up of the carbon powder can be suppressed. Also, when providing the opening 22A at the central part, sublimation amounts at the central part which is difficult to sublimate and at the outer peripheral part which is likely to sublimate can be adjusted.

EXAMPLES

Example 1

First, a crucible in which a cylindrical internal space is provided inside was prepared. Then, an inner bottom part of the crucible was filled with a powder SiC source as a raw material. The particle diameter of powder particles of the material was set to 300 μm.

Then, a porous material formed of a SiC sintered body was provided on the powder of the SiC source. An entire surface of the SiC source was covered with the porous material. An average hole diameter of the porous material was 150 μm. The average hole diameter of the porous material was obtained such that the hole diameters of holes, which are included in a predetermined range observed by an optical microscope, were measured to determine the average hole diameter. This value was not largely different from a value measured using a mercury porosimetry. Here, a porosity of the porous material was 45%. The thickness of the porous material was set to 15% of the height of a vertical line from the surface of the SiC source to the inner bottom part.

Then, a seed crystal was placed in a crystal placing part to cause a crystal to grow to be a 6-inch SiC ingot. A carbon inclusion density in the produced SiC ingot was measured such that, after the SiC ingot was sliced to have a thickness of 1 mm, carbon inclusions which were present in a predetermined area were counted using a transmission optical microscope to determine the carbon inclusion density. The carbon inclusion density of Example 1 was $5.7 \times 10^3$ pieces/cm$^3$.

Comparative Example 1

Comparative Example 1 is different from Example 1 in that no porous material was provided. The other conditions were the same as in Example 1. The carbon inclusion density of Comparative Example 1 was $8.2 \times 10^4$ pieces/cm$^3$.

When comparing Example 1 with Comparative Example 1, the carbon inclusion density of Example 1 was lower. It is considered that this is because swirling up of the carbon powder remaining after sublimation of the SiC raw material was suppressed.

Example 2

In Example 2, a coverage (covering rate) of a surface of the SiC source with the porous material was changed using the porous material 22 of Modification Example 2 shown in FIG. 3. The other conditions were the same as in Example 1. A coverage of the SiC source with the porous material was set to 0% (corresponding to Comparative Example 1), 10%, 20%, 30%, 40%, 50%, 60%, 70%, 80%, 90%, 100% (corresponding to Example 1), respectively.

Figure 4:
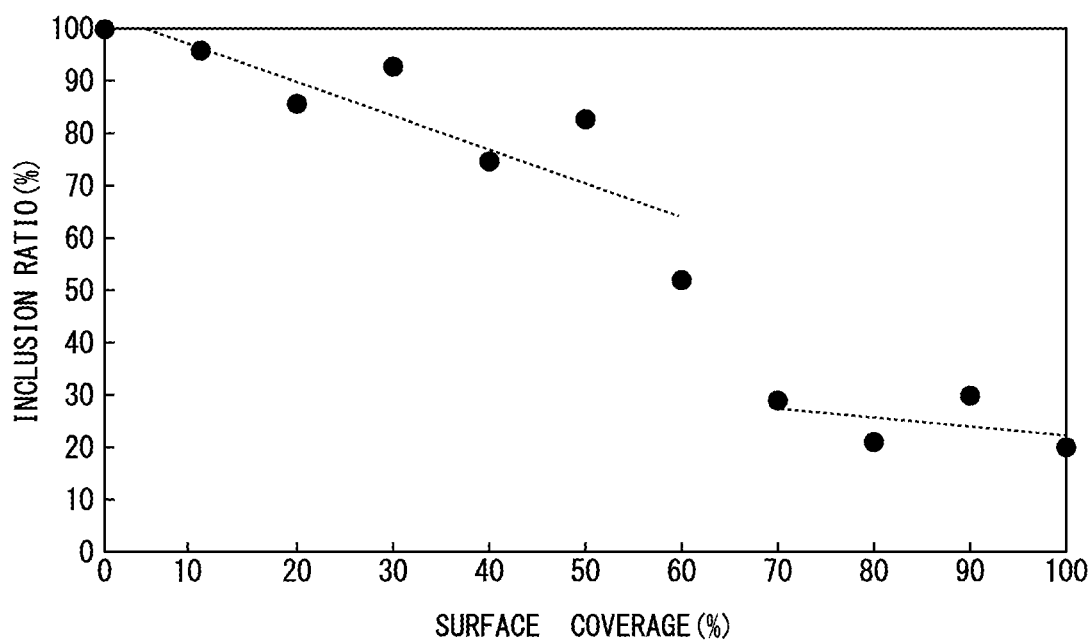
FIG. 4 is a graph showing an examination result of Example 2.

FIG. 4 shows an examination result of Example 2. A horizontal axis of FIG. 4 represents a coverage of a surface of the SiC source with the porous material. A vertical axis of FIG. 4 represents a ratio of the carbon inclusion density at each coverage, when the carbon inclusion density at the coverage of 0% (corresponding to Comparative Example 1) is set to 100%.

As shown in FIG. 4, when the surface of the SiC source was covered with the porous material, the carbon inclusion density was reduced. In addition, when the coverage exceeds 70%, the ratio of the carbon inclusion density was greatly reduced.

Example 3

In Example 3, a ratio of the thickness of the porous material to the height of the vertical line from the surface of the stored SiC source to the inner bottom part was changed. The other conditions were the same as in Example 1. In each of examples in which the thickness of the porous material was set to 10%, 20%, 30%, 40%, and 50%, of the height of the vertical line from the surface of the stored SiC source to the inner bottom part, the carbon inclusion density (triangle in the drawing) and the sublimation amount of the SiC source (circle in the drawing) were determined.

Figure 5:
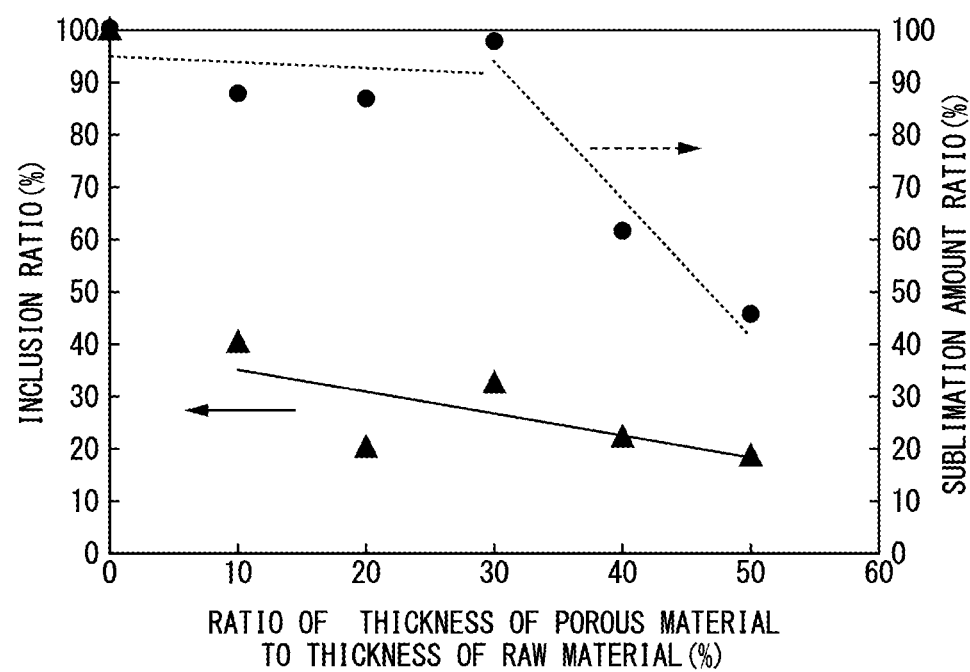
FIG. 5 is a graph showing an examination result of Example 3.

FIG. 5 shows an examination result of Example 3. The horizontal axis of FIG. 5 represents a ratio of the thickness of the porous material to the height of the vertical line from the surface of the stored SiC source to the inner bottom part. Left vertical axes of FIG. 4 represent a ratio of the carbon inclusion density, when the carbon inclusion density at the coverage of 0% (corresponding to Comparative Example 1) is set to 100%.

Right vertical axes of FIG. 4 represent a ratio of the sublimation amount, when the sublimation amount at the coverage of 0% (corresponding to Comparative Example 1) is set to 100%.

As shown in FIG. 5, when the thickness of the porous material increased, the carbon inclusion density was reduced. On the other hand, as the thickness of the porous material increased, the sublimation amount of the SiC source was reduced. In a region where the thickness of the porous material was less than 40% of the height of the vertical line from the surface of the stored SiC source to the inner bottom part, the reduction of the sublimation amount was small.

INDUSTRIAL APPLICABILITY

It is possible to provide a method of manufacturing a SiC single crystal and a covering member by which soaring of a remaining carbon powder can be suppressed, wherein such a soaring is caused due to Si sublimated first from a SiC source powder.

EXPLANATION OF REFERENCES

1 Seed crystal
10 Crucible
11 Inner bottom part
12 Crystal placing part
20, 21, 22 Porous material
21A Hole
21*a* First face (face A)
21*b* Second face (face B)

22A Opening
30 Heater
M SiC source
Ma First surface

The invention claimed is:

1. A method of manufacturing a SiC single crystal, comprising:
   a storing step of storing a SiC source which is a powder in an inner bottom part of a crucible, wherein the crucible is also configured to attach a seed crystal to a position of the crucible which faces the SiC source;
   a placing step of placing a porous material on at least a portion of a first surface of the SiC source, wherein the first surface is positioned on a side of the seed crystal; and
   a crystal growth step of sublimating the SiC source by heating to grow the SiC single crystal on the seed crystal,
   wherein the porous material is a compact sintered body in which holes have been formed,
   the porous material has a face A on the side of the seed crystal and a face B on a side of the SiC source, and has a plurality of holes communicating with the face B from the face A in a thickness direction of the porous material,
   a hole diameter of the holes of the porous material is 70% or less of an average particle diameter of powder particles which form the SiC source,
   the porous material consists of a SiC sintered body, and
   the hole diameter of the holes is constant in the thickness direction of the porous material.

2. The method of manufacturing a SiC single crystal according to claim 1,
   wherein the porous material covers 70% or more of the first surface of the SiC source.

3. The method of manufacturing a SiC single crystal according to claim 1,
   wherein the porous material has an opening at a center thereof, and
   the porous material covers an outer side of the first surface of the SiC source.

4. The method of manufacturing a SiC single crystal according to claim 1,
   wherein a thickness of the porous material is smaller than 40% of a height of the stored SiC source.

5. The method of manufacturing a SiC single crystal according to claim 1,
   wherein a whole of the first surface of the SiC source is covered with the porous material.

6. The method of manufacturing a SiC single crystal according to claim 1,
   wherein the hole diameter of the holes is 60% or less of the average particle diameter of the powder particles which form the SiC source.

7. The method of manufacturing a SiC single crystal according to claim 1,
   wherein porosity of the porous material is 40% or more and 60% or less.

8. The method of manufacturing a SiC single crystal according to claim 1,
   wherein porosity of the porous material is 45% or more and 50% or less.

9. The method of manufacturing a SiC single crystal according to claim 1,
   wherein the hole is formed perpendicular to the face A and the face B.

* * * * *